US012119247B2

United States Patent
Marzinotto et al.

(10) Patent No.: US 12,119,247 B2
(45) Date of Patent: Oct. 15, 2024

(54) METHOD FOR MONITORING, DETERMINING THE POSITION OF, AND POSITIONING A PIN-LIFTING SYSTEM

(71) Applicant: VAT Holding AG, Haag (CH)

(72) Inventors: Alejandro Marzinotto, Sennwald (CH); Adrian Eschenmoser, Werdenberg (CH); Andreas Hofer, Chur (CH); Frantisek Balon, Sevelen (CH); Michael Zickar, Goldach (CH)

(73) Assignee: VAT HOLDING AG, Haag (CH)

( * ) Notice: Subject to any disclaimer, the term of this patent is extended or adjusted under 35 U.S.C. 154(b) by 18 days.

(21) Appl. No.: 17/777,116

(22) PCT Filed: Nov. 18, 2020

(86) PCT No.: PCT/EP2020/082563
§ 371 (c)(1),
(2) Date: May 16, 2022

(87) PCT Pub. No.: WO2021/099403
PCT Pub. Date: May 27, 2021

(65) Prior Publication Data
US 2022/0399217 A1    Dec. 15, 2022

(30) Foreign Application Priority Data
Nov. 21, 2019   (DE) .................. 10 2019 008 104.8

(51) Int. Cl.
G03F 7/20        (2006.01)
H01L 21/67       (2006.01)
H01L 21/687      (2006.01)

(52) U.S. Cl.
CPC .. H01L 21/67259 (2013.01); H01L 21/68742 (2013.01)

(58) Field of Classification Search
CPC .................. H01L 21/67259; H01L 21/68742
See application file for complete search history.

(56) References Cited

U.S. PATENT DOCUMENTS 6,359,405 B1 *  3/2002  Tsurumi ................ B60K 6/485
                                                    318/434
6,481,723 B1    11/2002  Hao et al.
(Continued)

FOREIGN PATENT DOCUMENTS

CN      106486411 A    3/2017
EP        3361316 A1   8/2018
(Continued)

OTHER PUBLICATIONS

"Notification of Transmittal of the International Search Report and the Written Opinion of the International Searching Authority, or the Declaration," International Filing Date: Nov. 18, 2020, International Application No. PCT/EP2020/082563, Applicant: VAT Holding AG, Date of Mailing: Feb. 26, 2021, pp. 1-9.

*Primary Examiner* — Mesfin T Asfaw
(74) *Attorney, Agent, or Firm* — Muncy, Geissler, Olds & Lowe, P.C.

(57) ABSTRACT

Method for monitoring a state of a pin lifter device (10), wherein the pin lifter device (10) is designed for moving and positioning a substrate in a process atmosphere region (P). The pin lifter device (10) has a coupling (18) and a drive unit (12) having an electric motor, which is designed and interacts with the coupling (18) in such a way that the coupling (18) is adjustable from a lowered normal position into an individual active position and back. The method for monitoring includes progressively receiving a present item of motor current information with respect to a motor current applied to the electric motor, comparing the present motor current information to an item of target current information, (Continued)

and deriving an item of state information based on the comparison.

15 Claims, 2 Drawing Sheets

(56) References Cited

U.S. PATENT DOCUMENTS

| | | |
|---|---|---|
| 6,646,857 B2 | 11/2003 | Anderson et al. |
| 10,784,142 B2 | 9/2020 | Inc |
| 2002/0141133 A1 | 10/2002 | Anderson et al. |
| 2006/0238953 A1 | 10/2006 | Hanawa et al. |
| 2010/0075488 A1 | 3/2010 | Inc. |
| 2010/0208409 A1 | 8/2010 | Bluck et al. |
| 2011/0236162 A1* | 9/2011 | Shikayama ....... H01L 21/68742 414/222.01 |
| 2013/0059447 A1* | 3/2013 | McMillin ............ H01L 21/6833 361/234 |
| 2014/0324221 A1 | 10/2014 | Chisholm et al. |
| 2017/0187313 A1* | 6/2017 | Meyer ................... F01C 1/3566 |
| 2021/0116820 A1* | 4/2021 | Van Dorst ........... G03F 7/70725 |

FOREIGN PATENT DOCUMENTS

| | | |
|---|---|---|
| JP | 2008-270721 A | 11/2008 |
| JP | 2010-278271 A | 12/2010 |
| JP | 2017-050534 A | 3/2017 |
| TW | 201931514 A | 8/2019 |

* cited by examiner

METHOD FOR MONITORING, DETERMINING THE POSITION OF, AND POSITIONING A PIN-LIFTING SYSTEM

CROSS-REFERENCE TO RELATED APPLICATIONS

The present application is the National Stage of International Application No. PCT/EP2020/082563, filed on Nov. 18, 2020, which claims priority from German patent application No. 10 2019 008 104.8 filed on Nov. 21, 2019, the disclosure of both of which should be understood to be incorporated into this specification.

The invention relates to methods for monitoring, determining the position, and positioning of a pin lifter device of a pin lifter system for moving and positioning a substrate in a process chamber as well as a corresponding pin lifter system.

Pin lifter devices, also called pin lifters, are typically conceived and provided for the receiving and defined positioning of a substrate to be processed in a process chamber. They are used in particular in vacuum chamber systems in the fields of IC, semiconductor, flat-panel, or substrate manufacturing, which has to take place in a protected atmosphere as much as possible without the presence of contaminating particles.

Such vacuum chamber systems comprise in particular at least one vacuum chamber, which can be evacuated and is provided for receiving semiconductor elements or substrates to be processed or produced, and which has at least one vacuum chamber opening, through which the semiconductor elements or other substrates can be guided into and out of the vacuum chamber. For example, in a manufacturing plant for semiconductor wafers or liquid crystal substrates, the highly sensitive semiconductor or liquid crystal element sequentially pass through multiple process vacuum chambers, in which the parts located inside the process vacuum chambers are processed by means of a processing device in each case.

Such process chambers frequently have at least one transfer valve, whose cross section is adapted to the substrate and robot and through which the substrate can be introduced into the vacuum chamber and possibly removed after the provided processing. Alternatively, for example, a second transfer valve can be provided, through which the processed substrate is moved out of the chamber.

The substrate, for example a wafer, is guided, for example, using a correspondingly designed and controlled robot arm, which can be guided through the opening of the process chamber that can be provided with the transfer valve. The process chamber is then equipped by means of gripping the substrate using the robot arm, moving the substrate into the process chamber, and depositing the substrate in the chamber in a defined manner. The process chamber is emptied correspondingly.

A comparatively high level of accuracy and mobility of the substrate has to be ensured for depositing the substrate and for accurately positioning the substrate in the chamber. Pin lifter systems are used for this purpose, which provide a plurality of support points for the substrate and thus a load distribution (due to the intrinsic weight of the substrate) over the entire substrate.

The pins are preferably located in a receiving position and the robot deposits the substrate on the pins located in this position. Alternatively, the substrate can be moved into position, for example, by means of the robot via the support pins of the lifting device and lifted by the pins. After the robot has moved away, the substrate is deposited by lowering the pins on a carrier, for example a potential plate (chuck), and the robot arm which typically carries the substrate is moved out of the chamber, for example simultaneously with the depositing of the substrate. The pins can be lowered further after the depositing of the substrate and are then provided separately from it, i.e., there is no contact between the pins and the substrate. After removing the robot arm and closing (and introducing process gas into or evacuating) the chamber, the processing step is carried out.

A low force action on the substrate is of great importance in particular even after the process step is carried out in the chamber and during a subsequent lifting of the substrate, since the substrate can adhere to the carrier, for example. If the substrate is pressed away from the carrier too fast, a fracture of the substrate can occur here, since the adhesive forces cannot be overcome or released at least at certain support points. Moreover, as the contact occurs between the support pins and the substrate, an impact occurring in this case on the substrate can also result in an undesired strain (or fracture).

At the same time, in addition to the softest and most careful handling possible of the substrates to be processed, the shortest possible processing time is also to be enabled. This means that the substrate can be moved as quickly as possible into the defined states—loading and unloading position and processing position—in the chamber.

To avoid undesired impacts during, for example the processing of semiconductor wafers, U.S. Pat. No. 6,481, 723 B1 proposes the use of a special stop device instead of hard movement stops in a pin lifter. Any hard plastic stops are to be replaced here by a combination of a stop part designed to be soft and a hard stop, wherein for the movement limiting, firstly the contact with the soft stop part is established and subsequently and appropriately damped, the hard stop is brought into contact.

U.S. Pat. No. 6,646,857 B2 proposes a regulation of the lifting movement by means of a detected occurring force. The support pins can be moved here in dependence on the received force signal, so that the lifting force at the support pins always acts in a correspondingly metered and controlled manner on the wafer.

With each processing cycle, the support pins (pins) are brought into contact with the substrate to be received and released from it. Of course, corresponding mechanical strains (for example impacts) of the pins and the drive occur in this case. The processing cycles are often clocked comparatively tightly and occupy a relatively short processing time. A large number of repetitions in a comparatively short time can be the result of this process implementation. The support pins are therefore typically considered to be consumable material and require regular replacement, i.e., they are typically to be replaced after a certain number of cycles or a specific operating time.

Of course, a part of such a pin lifter device is connected to a process volume (process chamber), for example, the pin lifter device is flanged onto the process chamber. The various states of the chamber (e.g., temperature, potential) typically correspondingly influence the state of the pin lifter device due to such a connection.

With respect to the movement of the substrate in the process chamber, both exact positioning of the substrate with the aid of the pin lifter and also a corresponding mobility of the substrate have to be ensured. Moreover, an initial calibration of a pin lifter device is required in most cases, i.e., after the installation of the pin lifter device, for example a position has to be defined and stored for the pin lifter device, in which a support pin of an extension movement comes into contact with the substrate.

The setting of such positions can mean a time-consuming method, wherein a respective pin of a pin lifter is iteratively adjusted until it is provided in a target position.

It is therefore the object of the present invention to provide an improved pin lifter system, in which the above disadvantages are reduced or avoided.

It is especially the object of the invention to provide an improved pin lifter system which enables simplified, in particular automated support pin positioning.

It is a further special object of the invention to provide an improved pin lifter system which enables monitoring of a processing process.

These objects are achieved by the implementation of the characterizing features of the claims. Features which refine the invention in an alternative or advantageous manner can be inferred from the dependent claims.

The invention relates to a method for monitoring a state of a pin lifter device, in particular a pin lifter, wherein the pin lifter device is designed for moving and positioning a substrate, in particular a (semiconductor) wafer or ring, in a process atmosphere region that can be provided by a vacuum process chamber. The pin lifter device has a coupling, which is designed to receive a support pin designed to contact and support the substrate, and has a drive unit having an electric motor, which is designed and interacts with the coupling in such a way that the coupling is adjustable linearly along an adjustment axis from a lowered normal position into an individual active position and back. The lowered normal position corresponds in particular to a provision of the support pin in an essentially inactive state (no contact with the substrate) with respect to its intended effect (for example, moving, supporting, and positioning a workpiece or substrate), wherein the individual active position in particular corresponds to providing the intended effect of receiving and/or providing the substrate by way of the support pin.

The intended effect of the support pin is essentially understood as receiving, contacting, moving, supporting, and/or positioning, etc. a workpiece or substrate. An inactive state of the support pin is to be understood in this context as a state in which the pin is provided in a contactless manner (not yet or no longer in contact) with an intended substrate to be contacted and in particular temporarily does not provide the intended purpose, is thus, for example in a lowered waiting position. This is the case in particular while a processing process is carried out on the substrate. The provision of the intended effect does not mean exclusively, however, that a contact between support pin and substrate exists, rather the pin can be provided in an extended state in this state and can be kept ready for receiving a wafer (depositing the wafer on the pin). The processes or movements taking place as a result upon contact (transport of the wafer) are also to be understood as providing the intended effect.

The method for monitoring includes progressively receiving a present item of motor current information with respect to a motor current applied to the electric motor, comparing the present motor current information to an item of target current information, and deriving an item of state information based on the comparison of the present motor current information to an item of target current information.

Therefore, the presently applied motor current can be detected using this monitoring method, in particular by measurement, and a check can be performed as to whether the measured current is, for example, in a defined target range or specific state changes may be concluded on the basis of the current curve. With continuous measuring and checking, continuous monitoring can thus be performed with respect to the functionality of the pin lifter device and/or with respect to a process sequence.

The state information can be generated, for example as an output (acoustic and/or visual) or output signal. The output can comprise
 a warning about overshooting or undershooting a desired or permissible motor load, and/or
 an item of information about an achieved process quality, wherein if a present motor current is provided in a permitted tolerance range around the target current, a desired processing could be concluded.

The method can thus provide a processing and analysis functionality for the motor current information. The pin lifter device can be connected for this purpose to a control and processing unit for the wired or wireless exchange of information and/or data.

According to one specific embodiment, the method can comprise steps in which based on multiple detections of the state information, a state trend is derived (in particular as the output), in particular a long-term trend, for a system state and/or a change of the system state, in particular wherein the state information is detected during a specific time window periodically, in particular progressively, and a current (load)-distance ratio is derived.

A change of the function of the pin lifter device can thus be monitored and recognized by such an evaluation of the motor data. The long-term observation thus not only enables the acquisition of snapshots of the system, but rather moreover the derivation of trends and the prediction of further state changes.

The state information can additionally relate, for example to lifting of the substrate off the support pins. In an extended state of the support pins, which support the substrate, the motor current is monitored for this purpose, wherein a determinable drop of the current corresponds to a load reduction and thus lifting off of the substrate.

The method can furthermore be designed to provide, based on a comparison of the state information to a predefined reference value or the target current information, an output with respect to an evaluation of a process carried out using the pin lifter device. On the basis of the evaluation of the detected motor information, a production step (for example coating process) can thus be monitored. If a measured item of load or force information deviates from a target value (in particular including tolerance), this can be, for example an indication of incorrect lifting of a wafer off a support (de-chucking) under excessively large force action and can cause damage to the wafer.

In a further embodiment, the invention relates to a method for determining the position for the coupling of the pin lifter device, wherein the pin lifter device is arranged at a vacuum process chamber and is designed for moving and positioning a substrate in the process atmosphere region that can be provided by the vacuum process chamber. The coupling has a support pin in this case, wherein the support pin is received and held by the coupling.

The method for determining the position comprises providing a reference substrate in the vacuum process chamber. Moreover, the method makes use of the above method for state determination, i.e., the method for state determination is executed. The coupling is moved along the adjustment axis, the support pin is brought into contact with the reference substrate, and a contact point is derived on the basis of the progressive comparison of the present motor current information to an item of target current information, wherein the contact point represents a position of the coupling along the adjustment axis.

A substrate or another body having a suitable surface (which is also to be understood as a substrate in this context) can thus be provided in the process chamber. The support pins of the provided pin lifter devices are then extended, wherein the motor current is monitored, until the motor current rises above a level which would be expected upon a movement without additional load (target current information). At this point, the contacting of the substrate by the support pin takes place. The corresponding adjustment positions of the respective couplings or the respective support pins can be stored and saved as respective contact points.

Alternatively, the support pins can also be extended farther after the contact and the curve of the motor current can be logged. The contact point can then also be derived on the basis of the current curve thus recorded, for example, on the basis of a slope change in the curve. The target current information relates in such a case at least to a target slope or reference slope of the current curve.

The target current information generally forms a basis for deciding whether a detected item of motor current information appears plausible or not in the context of specific process requirements.

The method can thus be designed in particular for the purpose of acquiring a state change, in particular a force increase due to contacting the substrate, during an extension movement of the coupling equipped with a support pin into the support position and in particular to link it to an extension position.

Thus, for example, a force-distance diagram can be acquired and saved for a specific process. Deviations can be established here with reference to a distance covered and/or a measured force. Alternatively or additionally, the contact point can be derived on the basis of a force curve or load curve, i.e. an extension position for the pin at which a contact with a substrate occurs.

In one embodiment, a motor current curve can thus be derived based on the continuous acquisition of the present motor current information and the state information can be derived on the basis of the motor current curve.

The motor current information can furthermore be correlated with an item of position information with respect to the positioning of the coupling along the adjustment axis (load-distance) and the state information can be derived on the basis of a position-correlated motor current or motor current curve that can be provided in this way.

In one embodiment, the state information can have an item of information with respect to adhesion and/or release of the substrate on or from a substrate carrier and/or a support pin.

The invention moreover relates to a method for positioning the coupling of an above-described pin lifter device, which is arranged at a vacuum process chamber and is designed for moving and positioning a substrate in a process atmosphere region that can be provided by the vacuum process chamber and the coupling of which has a support pin.

The method for positioning includes obtaining a contact point and activating the electric motor in such a way that the coupling is moved along the adjustment axis into a contact position corresponding to the contact point.

The contact point is in particular derived and/or defined by a preceding embodiment of an above-described method for determining a contact point by means of moving and bringing into contact the support pin or on the basis of a shape and position (in the vacuum chamber) of a substrate to be processed in the vacuum chamber.

In a first step, an exemplar of a substrate to be processed, which can be flat, curved, or alternatively structured, can thus be placed in a process chamber in a target position and the respective contact points for the pins can be determined by means of approach using the support pins. In a later second step, a substrate to be processed—or a large number of such substrates—can be deliberately contacted and moved in the processing process on the basis of the previously obtained position information.

In particular the support pin contacts the substrate in the contact position, in particular wherein the substrate is received by the support pin.

In one embodiment of a method according to the invention, the drive unit is activated based on the state information in such a way that the present motor current information is approximated to the target current information, in particular progressively until the present motor current information is in a tolerance range associated with the target current information.

Thus, for example, a closed-loop control (regulation) of the pin lifter movement can be performed on the basis of acquired, processed, and/or analyzed measurement data. For example, the continuous application of a constant force over a specific movement distance or the application of a specific load at one or more of the support pins provided in a pin lifter system can be regulated. Such a control is preferably implemented in the control and processing unit of the system, in particular at least algorithmically.

In one embodiment, the method can be designed to generate and output a control signal based on the state information. The drive unit can be arranged and designed here to receive a control signal and to adjust the coupling between the normal position and the support position in dependence on the control signal. In other words, the system can be designed in such a way that the control of the drive is based on acquired measured values (open-loop or closed-loop).

In particular, the method can be performed in such a way that the control signal is automatically settable in dependence on a present item of state information. A regulation of the pin lifter operation can be provided by a progressive adaptation of the control signal and, for example, an adjustment speed can be set in dependence on a respective measured contact pressure force.

Such a configuration enables a control and/or regulation of the pin lifter on the basis of a presently acquired item of current information. In this way, the control of the drive unit can be adapted in such a way, in particular progressively or in real time, that effects, for example strong vibration, which can have an influence on a processing process, can be compensated for. Such a compensation can thus be implemented without structural intervention in the system, only by means of adaptation of the control.

The invention additionally relates to a pin lifter system, in particular a pin lifter system, which is designed for moving and positioning a substrate, in particular a wafer, in a process atmosphere region that can be provided by vacuum process chamber. The pin lifter system has at least one pin lifter device individually activatable for moving and positioning the substrate, having a coupling, which is designed to receive a support pin embodied for contacting and supporting the substrate, and a drive unit having an electric motor. The drive unit is designed and interacts with the coupling in such a way that the coupling is adjustable linearly along an adjustment axis from a lowered normal position, in particular for providing the support pin in a state essentially inactive with respect to its intended effect, into an individual active position, in particular for providing the intended effect of receiving and/or providing the substrate by way of the support pin, and back. The pin lifter system moreover has a control and processing unit which is connected to the drive unit and is designed to control the electric motor.

The control and processing unit is configured to execute one of the above-described methods. The control and processing unit has a corresponding functionality for this purpose, which is capable of executing or controlling the respective steps of the method that can be controlled, monitored, and/or executed on the part of the control and processing unit.

In one embodiment, the control and processing unit has a monitoring functionality configured in such a way that upon its execution, a present item of motor current information with respect to a motor current applied to the electric motor is progressively acquired and an item of state information is derived on the basis of a continuous comparison of the present motor current information to an item of target current information.

In one embodiment, a reference substrate is provided in the vacuum process chamber and the control and processing unit has a position determination functionality configured in such a way that upon its execution, the coupling is moved along the adjustment axis, in particular starting from the lowered normal position, the support pin is brought into contact with the reference point due to the movement, and a contact point is derived on the basis of the continuous comparison of the present motor current information to the target current information, wherein the contact point represents a position of the coupling along the adjustment axis.

In one embodiment, a positioning point for the coupling is provided and the control and processing unit has a positioning functionality configured in such a way that upon its execution, the electric motor is activated in such a way that the coupling is moved along the adjustment axis into a contacting position corresponding to the positioning point.

In particular, the positioning point for the coupling is derived as the contact point by a preceding execution of the position determination functionality or derived and/or defined on the basis of a shape and position in the vacuum chamber of a substrate to be processed in the vacuum chamber.

In one embodiment, the pin lifter device has a separating device for separating the process atmosphere region from an exterior atmosphere region, wherein the drive unit is associated at least partially, in particular completely, with the exterior atmosphere region and the coupling is associated in particular at least partially with the process atmosphere region. The separating device is formed in particular as a bellows in the interior of the pin lifter device. The separating device of the pin lifter device can also be formed by a housing of the drive unit.

The drive unit can be designed as an electric motor, in particular a stepping motor, whereby a mechatronic pin lifter device is provided.

According to one specific embodiment, the pin lifter system has at least three pin lifter devices individually activatable for moving and positioning the substrate. Each of the pin lifter devices has a coupling which is designed to receive a support pin embodied for contacting and supporting the substrate, and a drive unit having an electric motor, each of which is designed and interacts with the respective coupling in such a way that the coupling is adjustable linearly along an adjustment axis from a lowered normal position, in particular for providing the support pin in a state essentially inactive with respect to its intended effect, into an individual active position, in particular for providing the intended effect of receiving and/or providing the substrate by way of the support pin, and back.

The control and processing unit is connected to each of the drive units and is designed for (individual) control of the respective electric motors. The control and processing unit is moreover designed for executing the monitoring functionality or the position determination functionality or the positioning functionality for each of the pin lifter devices.

Upon execution of the monitoring functionality, an item of state information is derived for each of the pin lifter devices, upon execution of the position determination functionality, a contact point is derived for each of the pin lifter devices, and upon execution of the positioning functionality, the coupling of each pin lifter device is moved into a respective individual contacting position.

In one embodiment, upon execution of the positioning functionality, the couplings can be moved in a controlled manner into different positions, in particular wherein the support pins are extended different distances. This is advantageous in particular for the processing of non-flat substrates.

The invention moreover relates to a computer program product, which is stored on a machine-readable carrier or is embodied by an electromagnetic wave, having program code for controlling or executing an above-described method, in particular when the program is executed in a control and processing unit of a described pin lifter system.

The devices according to the invention are described in greater detail hereinafter solely by way of example on the basis of specific exemplary embodiment schematically illustrated in the drawings, wherein further advantages of the invention are also discussed. In the specific figures.

Figure 1:
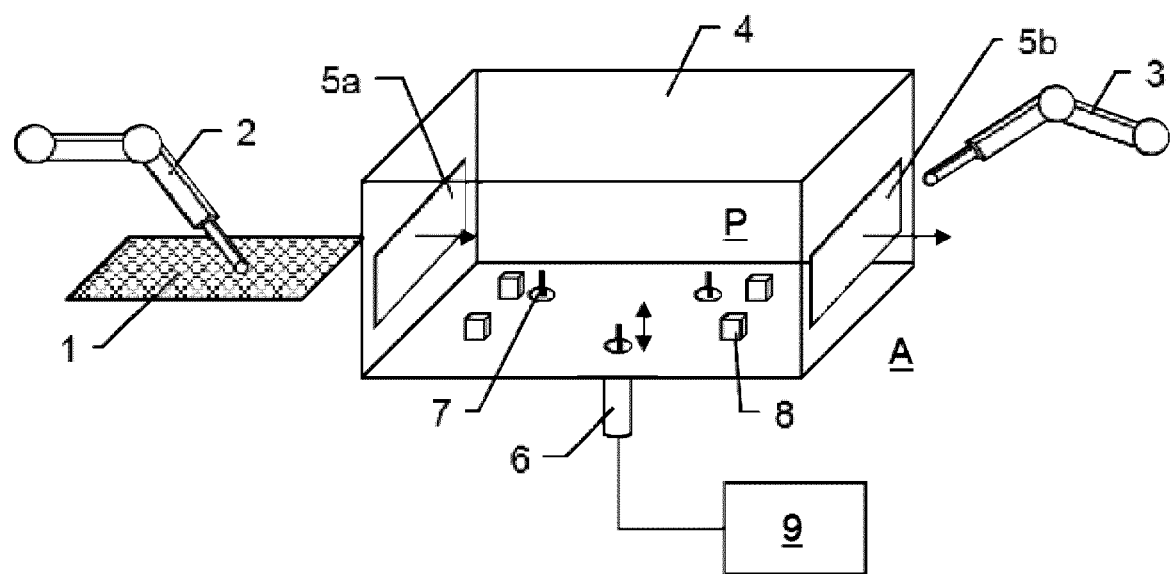
FIG. 1 shows a schematic illustration of an embodiment of a vacuum processing device for a wafer having a pin lifter system according to the invention.

FIG. 1 schematically shows a process setup for processing a semiconductor wafer 1 under vacuum conditions. The wafer 1 is introduced by means of a first robot arm 2 through a first vacuum transfer valve 5a into a vacuum chamber 4 (process atmosphere region P) and moved into position via support pins 7 of pin lifter devices (here: three pins shown) of a pin lifter system according to the invention. The wafer 1 is then received by means of the pins 7 or deposited thereon and the robot arm 2 is moved away. The wafer 1 typically rests on the robot arm or a support device provided on the robot arm 2, 3 or is held with a specific support device.

After the wafer 1 is received by the pins 7, the robot arm is guided out of the chamber 4, the transfer valve 5a is closed, and the pins 7 are lowered. This takes place by means of the electric drives 6 of the pin lifter devices that are coupled to the respective pins 7. The wafer 1 is deposited on the four support elements 8 shown in this way. Alternatively, the wafer 1 is deposited on an electrostatic clamping device (not shown), a so-called electrostatic chuck, and fixed between the chuck electrodes by applying an electric voltage and possibly leveled by the forces acting in this way. Electrostatic chucks are presently typically used for the production, for example, of semiconductor wafers under vacuum conditions.

In this fixed state, planned processing (e.g., coating, deposition, etc.) of the wafer 7 is performed under vacuum conditions and in particular in defined atmosphere (i.e., using a specific process gas and under defined pressure). The chamber 4 is coupled for this purpose to a process gas source, a vacuum pump, and preferably to a vacuum regulating valve for regulating the chamber pressure (not shown).

After the processing, the wafer 1 is in turn lifted into a removal position by means of the pin lifter devices. Using the second robot arm 3, the wafer 1 is then removed through the second transfer valve 5b. Alternatively, the process can be conceived using only one robot arm, wherein equipping and removal can then take place through a single transfer valve.

Moreover, a processing and control unit 9 is shown, which is connected to the pin lifter devices. This unit 9 provides a controlled movement of the pins 7 and evaluation and further processing of items of information and signals which are generated or provided on the part of the pin lifters.

The control unit 9 can be communicatively (e.g., wirelessly by means of radio, Wi-Fi, Bluetooth, etc.) and/or electronically and/or electrically connected to the pin lifter devices. Furthermore, the control unit 9 can be integrated into one of the pin lifter devices of the system or the control unit 9 is embodied in its entirety by individual subcontrollers, which are provided in different pin lifter devices, but interact. The control unit 9 can be designed for wireless communication with the pin lifter devices and can provide individual activation and the reception of respective information for each individual pin lifter device. The control unit can be provided spatially separated from the pin lifter devices and can have, for example, a tablet PC, a mobile telephone, and/or a computer workstation.

Figure 2:
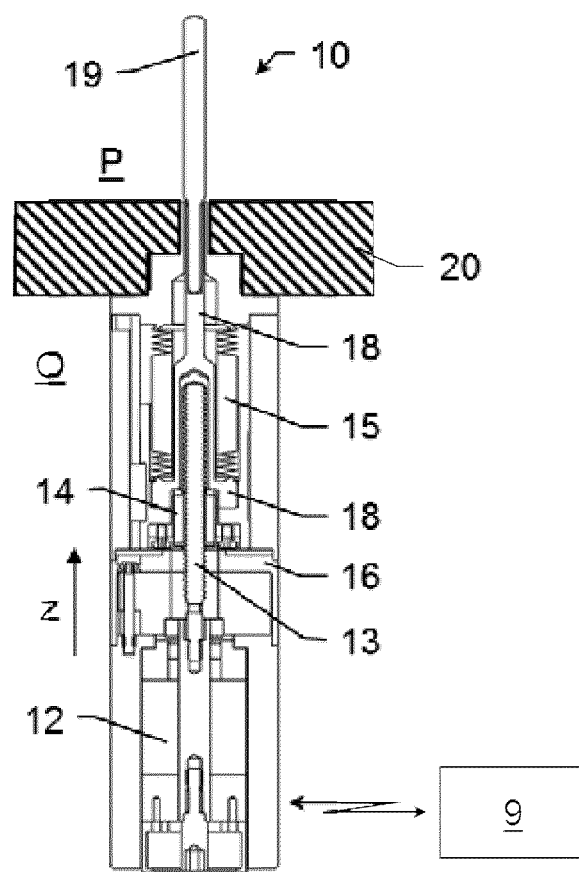
FIG. 2 shows an embodiment of a pin lifter device of a pin lifter system according to the invention.

FIG. 2 shows an embodiment of a pin lifter system according to the invention having a pin lifter device 10 and a control and processing unit 9.

A support pin 19 is locked in a coupling 18 of the device 10. The support pin 19 preferably includes a metallic, polymer-based, or ceramic material, in particular the pin 19 is completely manufactured from such a material. The locking in the coupling 18 can be implemented, for example magnetically or by a clamp.

The coupling 18 can be moved by means of a slide 14 in the z direction. The slide 14 is coupled for this purpose to a threaded spindle 13, which is in turn drivable by an electric motor 12 of the drive unit.

An optional thermal and electrical isolation between the upper coupling part and the lower drive part is implemented in one variant by a first isolating element 16, which thermally and electrically separates an upper housing part from a lower housing part. The second isolating element, which can be embodied by the slide 14, can preferably be provided. In this variant of the pin lifter device 10, the threaded spindle 13 is embodied and mounted precisely and rigidly in such a way that no (electrically or thermally conductive) contact occurs between the spindle 13 and the coupling 18—even during a relative movement. Alternatively, the spindle 13 is manufactured from a nonconductive or thermally isolating material or is coated with it. A complete galvanic and thermal separation is thus provided between upper and lower parts in every state of the device 10. In a further variant, both the threaded spindle 13 and also the slide 14 seated on the spindle 13 can be manufactured to be conductive (for example, metallic). Isolation can then be implemented in particular by means of, for example, an intermediate sleeve between spindle/slide and coupling.

It is obvious that the above-mentioned galvanic separation is solely optional, but the invention also extends to embodiments without such a separation.

The pin lifter 10 furthermore has a bellows 15 in the interior. The bellows 15 is arranged and formed in such a way that an atmospheric separation of a process atmosphere region P, in which the support pin 19 (pin) is present and in which typically a processing process takes place, and an exterior atmospheric region O, in which, for example, the drive 12 and further peripheral components can be present, can be provided. The bellows 15 is compressed during an extension of the pin 19, wherein the atmospheric separation is maintained.

In the special variant shown, both the coupling 18 and also the bellows 15 are moved by an adjustment of the slide 14. Both coupling 18 and also bellows 15 are at least indirectly coupled to the slide. Especially, the slide 14 is connected to the coupling 18 and the coupling 18 is connected to the bellows 15. A second end of the bellows is in turn connected to the housing of the pin lifter device. The connections of the individual components are in particular embodied to be gas-tight.

The pin lifter device 10 is connected to the housing 20 of a vacuum process chamber. The connection is embodied in such a way that an interior process atmosphere of the process chamber also acts in the interior of the pin lifter device 10. A feedthrough in the housing wall 20 provided for the pin 19 ensures the extension of the process atmosphere into the lifter 10. That is to say, the process volume and a part of the internal volume of the pin lifter 10 form a common process atmosphere region P.

It is obvious that a pin lifter device according to the invention can alternatively have another seal concept implemented instead of a bellows, which also provides an atmospheric separation, for example a radial seal in the upper outlet region of the support pin 19 having, e.g., an O-ring or a membrane.

To move the movable system components, i.e. here the coupling 18 and the bellows 15, the electric motor 12 has to overcome a system load caused by these components. The load is dependent here on the structural embodiment of the components (for example mass), their movement properties (for example friction), and their present states (e.g., position, bellows compression, membrane tension, etc.). This motor system load (motor target state) is known for the pin lifter 10 or can be ascertained by calibration and saved in the control system. A lookup table, a model describing the lifter 10 sufficiently accurately, or a motor teaching process (repetition, monitoring, comparison, and storing of a specific movement sequence) can be used for this purpose. The motor system load thus describes a respective target state or normal state of the electric motor in operation under defined conditions, in particular in consideration of ambient conditions such as pressure, temperature, etc.

The control and processing unit 9 is provided for moving the lifter 10. For targeted activation, the motor 12 is supplied with a corresponding signal, for example to approach a specific pin position.

The control and processing unit 9 additionally has a monitoring function and interacts with the pin lifter device 10 in such a way that upon execution of the monitoring function, an item of information with respect to the motor current presently applied to the electric motor 12 is obtained (present motor current information) and this information is compared, in particular progressively, to an item of information about a known target current for the motor. On the basis of this comparison, in a further step, in particular also progressively, a respective present state of the pin lifter device or the motor is concluded. In other words, a present motor current can be compared to a corresponding target current and the state can be derived on the basis of a current difference.

The presently applied motor current is in particular a measure of a load applied to the motor. This load is influenced, as described above, by individual components of the pin lifter device. The monitoring of the motor current also enables, however, the determination of process malfunctions or of wear on the pin lifter device.

In one variant, the monitoring functionality can determine that a substrate adheres more strongly to an electrostatic chuck upon the attempt to lift it after processing than would be expected in the context of a normal process cycle. Specifically, this can be determined on the basis of an excessive increase of the motor current, in particular in correlation with an associated adjustment position. If a measured motor current exceeds, for example, a defined tolerance value, which is saved for desired lifting of a substrate to be processed, in a movement range in which a contact of the support pin with the substrate is to be expected, a corresponding item of information can be output and/or a further movement or adjustment of the support pin or the coupling can be interrupted or stopped.

The control and processing unit 9 furthermore has a position determination functionality. To execute this function, a reference substrate can be provided in the process chamber. The reference substrate can be an exemplar of a substrate to be processed or an alternative body having a preferably flat spatial extension and/or defined mass. The reference substrate is provided, for example, on the electrostatic receptacle and the pin lifter or pin lifters are extended until the measured motor current increases above a target level. Such a current increase represents in this case the contacting of the reference substrate with the support pin, since here the load applied to the motor can increase suddenly. A position of the coupling or the support pin, at which the contacting takes place, can be derived on the basis of the determination of the increased motor current or on the basis of a chronological motor current curve. In this way, for example, a pin lifter or a plurality of pin lifters can be calibrated.

The contacting position can be stored in the system or on the respective pin lifter itself. On the basis of this position information thus stored, the respective pin lifter can subsequently be moved in a controlled manner directly into this previously determined contacting position. This is provided in particular by execution of a positioning functionality of the control and processing unit 9. Such a setting of a specific position of a pin lifter can be advantageous in particular in the event of a replacement of a single lifter. It can then be incorporated into the system with comparatively little effort and, for example, can be operated synchronously with the remaining lifters of the system.

Furthermore, a plurality of such position points can be defined for each pin lifter in a pin lifter system. The position points of the respective pin lifters can moreover differ. Thus, for example, the pin lifter devices in the system, on the one hand, can be moved into a first contact position, in which the contacting of a substrate takes place and, in a second step, can be moved together into a removal position, in which the substrate is lifted off of the support pins. Due to the definition of different position points for the lifters, for example, substrates having a curved shape can be received and moved, wherein a uniform force distribution on the individual pin lifter devices is still provided.

As described, the position points can be determined and defined on the basis of monitoring of the motor current, wherein in each case a substrate is provided or removed in the respective position. A corresponding current change can be acquired by way of an accompanying load change at the motor. The position points can alternatively or additionally be defined on the basis of the known shape of the substrate to be processed. For this purpose, for example, a model of the substrate and/or the pin lifter system can be used and, for example, the contact points can be simulated. Alternatively, the contact points can also be determined arithmetically with knowledge of the shape and the arrangement of the individual pin lifter devices.

Figure 3A:
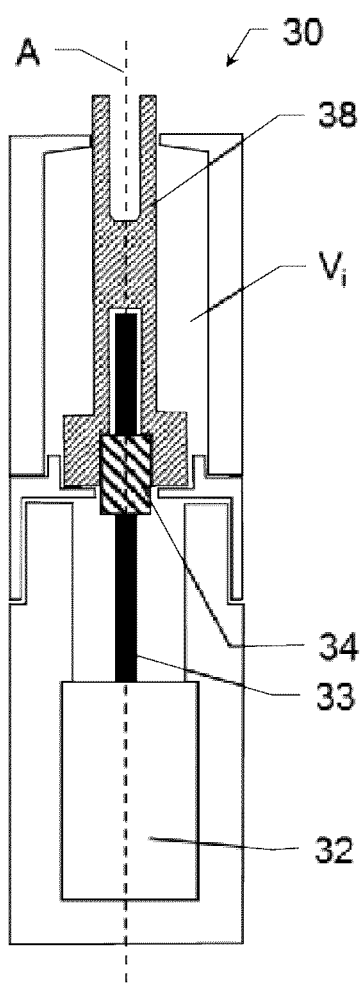
FIGS. 3a-b show a further embodiment of a pin lifter device of a pin lifter system according to the invention.

FIG. 3a shows an embodiment of a pin lifter device 30 of a pin lifter system according to the invention. The pin lifter device 30 has a drive unit 32 designed as an electric motor, which is associated with a lower drive part of the device 30. The motor 32 is coupled to a threaded spindle 33. The threaded rod 33 can be rotated by corresponding activation of the motor 32.

Moreover, an adjustment element 34 is provided, which is designed in the embodiment shown as a slide 34, which interacts with the threaded rod 33 and is linearly movable along a central adjustment axis A by means of rotation of the rod 33. The slide 34 has an internal thread which corresponds to the thread of the threaded rod 33.

Furthermore, the slide 34 is mounted in such a way that it is not rotatable in relation to the pin lifter device 30 itself, but rather can only be moved in movement directions in parallel to the adjustment axis A.

The slide 14 is directly coupled to the coupling 38, i.e., the coupling 38 can be linearly moved and positioned by the slide. The coupling 38 is formed at a first end to receive a support pin (support pin not shown). The coupling 38 extends essentially along the axis A in the example shown.

A mobility of the coupling 38 controllable by the motor 32 and thus of the support pin received in the coupling 38 can be provided by the connections between the slide 34 and the coupling 38.

FIG. 3a shows the coupling 38 of the pin lifter device 30 in a lowered normal position, in which an optionally provided support pin would be provided in an essentially inactive state with respect to its intended effect. The support pin typically has no contact with the substrate to be processed in this case upon a provision of the pin lifter 30 in a vacuum processing process.

Figure 3B:
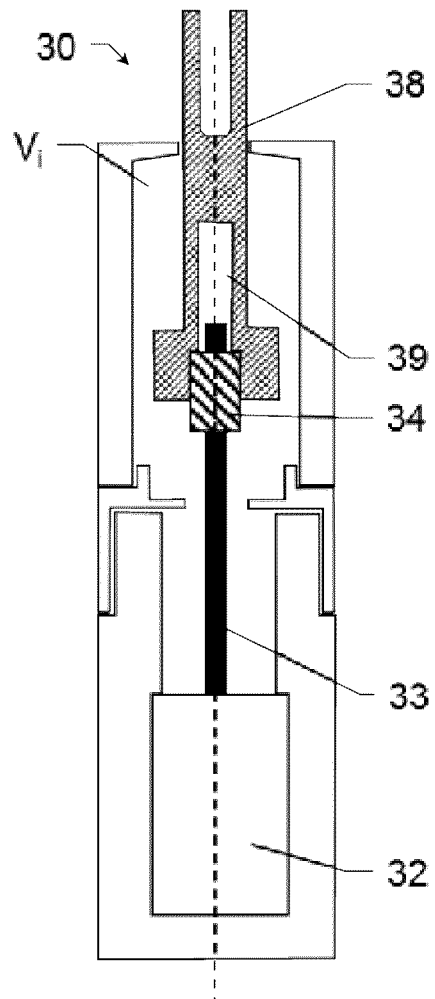

FIG. 3b shows the coupling 38 of the pin lifter device 30 in an extended support position, in which a coupled-on support pin provides its intended effect of receiving, moving, and/or providing the substrate.

To reach the extended support position, the motor 32 can be activated accordingly by means of a control and processing unit. For this purpose, for example, a runtime of the motor or a number of rotations to be executed for the threaded rod 33 can be saved in order to set a desired position for the slide 34. In particular, an encoder is coupled to the drive unit 32 in order to make it possible to monitor and regulate the movements of the motor axis.

The linearly movable parts of the pin lifter 30, i.e., the slide 34 and the coupling 38, are moved for this purpose essentially within the internal volume Vi. In the embodiment shown, the coupling 38 is formed at least partially sleeve-shaped and provides a recess 39. This recess 39 enables a variable extension of the threaded rod 33 into the coupling 38 and thus a translational mobility of the coupling 38 in relation to the threaded rod 33.

The control and processing unit (not shown), which is connected to the pin lifter device 30 and thus forms a pin lifter system, can have various functionalities for monitoring, determining the position, and positioning of the pin lifter device 30—as described above.

The control and processing unit can have a functionality for current-information-dependent activation of the drive unit 32. For this purpose, the control and processing unit receives an item of information about the present motor current, in particular a present measured value of the applied current. Moreover, the target current information is saved in particular as a target current. On the basis of a comparison of the presently applied current to the target current to be achieved (state information), a control signal for the drive 32 can be generated from the current difference. If, for example, a measured motor current is significantly less than a defined target current, the motor 32 can be supplied with more current and the load at the motor can thus be increased.

Such a control or regulation of pin lifter devices in a pin lifter system having multiple such devices, which can each be correspondingly activated or regulated individually, enables a targeted load distribution over a substrate to be moved. For example, less load can be applied to sensitive regions of a substrate in this way, while a greater load is applied in another region designed for this purpose. The target current information for each pin lifter device then corresponds to the respective load, which should or can act on the substrate at one point or region of the substrate.

The invention was explained on the basis of its preferred embodiment(s), but many further changes and variations can be performed without going beyond the scope of the present invention. It is therefore provided that the appended patent claims cover changes and variations which are included in the actual scope of the invention.

It is obvious that the illustrated figures only schematically represent possible exemplary embodiments. The various approaches can also be combined according to the invention with one another and with devices for substrate movement in vacuum process chambers, in particular pin lifters, of the prior art.

The invention claimed is:

1. A method for monitoring a state of a pin lifter device, in particular a pin lifter, wherein the pin lifter device is designed for moving and positioning a substrate, in particular a wafer or ring, in a process atmosphere region which can be provided by a vacuum process chamber, and includes
   a coupling, which is designed to receive a support pin embodied to contact and support the substrate, and
   a drive unit having an electric motor, which is designed and interacts with the coupling in such a way that the coupling is linearly adjustable along an adjustment axis from
      a lowered normal position, in particular for providing the support pin in an essentially inactive state with respect to its intended effect, into
      an individual active position, in particular for providing the intended effect of receiving and/or providing the substrate by way of the support pin,
   and back,
   wherein the method for monitoring includes
      progressively receiving a present item of motor current information with respect to a motor current applied to the electric motor,
      comparing the present motor current information to an item of target current information, and
      deriving an item of state information based on the comparison.

2. The method according to claim 1, wherein
   the state information includes an item of information with respect to adhesion and/or release of the substrate on or from a substrate carrier and/or a support pin.

3. A method for position determination for a coupling of a pin lifter device, in particular a pin lifter, wherein the pin lifter device is arranged at a vacuum process chamber and is designed for moving and positioning a substrate, in particular a wafer or ring, in a process atmosphere region which can be provided by the vacuum process chamber, and includes
   the coupling having a support pin and
   a drive unit having an electric motor, which is designed and interacts with the coupling in such a way that the coupling is linearly adjustable along an adjustment axis from
      a lowered normal position, in particular for providing the support pin in an essentially inactive state with respect to its intended effect, into
      an individual active position, in particular for providing the intended effect of receiving and/or providing the substrate by way of the support pin,
   and back,
   wherein the method for position determination includes
      providing a reference substrate in the vacuum process chamber,
      progressively receiving a present item of motor current information with respect to a motor current applied to the electric motor,
      comparing the present motor current information to an item of target current information,
      deriving an item of state information based on the comparison moving the coupling along the adjustment axis,
      bringing the support pin into contact with the reference substrate, and
      deriving a contact point on the basis of the progressive comparison of the present motor current information to an item of target current information,
      wherein the contact point represents a position of the coupling along the adjustment axis.

4. The method according to claim 3, wherein
   a motor current curve is derived based on the progressive acquisition of the present motor current information and the state information is derived on the basis of the motor current curve,
   and/or
   the motor current information is correlated with an item of position information with respect to the positioning of the coupling along the adjustment axis and the state information is derived on the basis of a position-correlated motor current or motor current curve which can be provided in this way.

5. A method for positioning a coupling of a pin lifter device, in particular a pin lifter, wherein the pin lifter device is arranged at a vacuum process chamber and is designed for moving and positioning a substrate, in particular a wafer or ring, in a process atmosphere region which can be provided by the vacuum process chamber, and includes
   the coupling having a support pin and
   a drive unit having an electric motor, which is designed and interacts with the coupling in such a way that the coupling is linearly adjustable along an adjustment axis from
      a lowered normal position, in particular for providing the support pin in an essentially inactive state with respect to its intended effect, into an individual active position, in particular for providing the intended effect of receiving and/or providing the substrate by way of the support pin, and back, wherein the method for positioning includes receiving a contact point and activating the electric motor in such a way that the coupling is moved along the adjustment axis in a contact position corresponding to the contact point.

6. The method according to claim 5, wherein the contact point is derived and/or defined on the basis of a shape and position in the vacuum chamber of a substrate to be processed in the vacuum chamber.

7. The method according to claim 5, wherein contacting of the support pin with the substrate in the contact position, in particular receiving of the substrate by the support pin.

8. The method according to claim 7 wherein based on the state information, the drive unit is activated in such a way that the present motor current information is approximated to the target current information, in particular progressively until the present motor current information is in a tolerance range associated with the target current information.

9. A pin lifter system, in particular a pin lifter system, which is designed for moving and positioning a substrate, in particular a wafer, in a process atmosphere region which can be provided by vacuum process chamber, having at least one pin lifter device individually activatable for moving and positioning the substrate having a coupling, which is designed for receiving a support pin embodied for contacting and supporting the substrate, and a drive unit having an electric motor, which is designed and interacts with the coupling in such a way that the coupling is linearly adjustable along an adjustment axis from a lowered normal position, in particular for providing the support pin in an essentially inactive state with respect to its intended effect, into an individual active position, in particular for providing the intended effect of receiving and/or providing the substrate by way of the support pin, and back, and a control and processing unit, which is connected to the drive unit and designed for controlling the electric motor, wherein the control and processing unit is configured to progressively receiving a present item of motor current information with respect to a motor current applied to the electric motor, comparing the present motor current information to an item of target current information, and deriving an item of state information based on the comparison.

10. The pin lifter system according to claim 9, wherein the control and processing unit has a monitoring functionality configured in such a way that upon its execution a present item of motor current information with respect to a motor current applied to the electric motor is progressively acquired and an item of state information is derived on the basis of a progressive comparison of the present motor current information to an item of target current information.

11. The pin lifter system according to claim 9, wherein a reference substrate is provided in the vacuum process chamber and the control and processing unit has a position determination functionality configured in such a way that upon its execution the coupling is moved along the adjustment axis, in particular starting from a lowered normal position, the support pin is brought into contact with the reference substrate by the movement, and a contact point is derived on the basis of the continuous comparison of the present motor current information to the target current information, wherein the contact point represents a position of the coupling along the adjustment axis.

12. The pin lifter system according to claim 11, wherein a positioning point for the coupling is provided and the control and processing unit has a positioning functionality configured in such a way that upon its execution the electric motor is activated in such a way that the coupling is moved along the adjustment axis into a contacting position corresponding to the positioning point.

13. The pin lifter system according to claim 12, wherein the positioning point for the coupling is derived and/or defined on the basis of a shape and position in the vacuum chamber of a substrate to be processed in the vacuum chamber.

14. The pin lifter system according to claim 9, wherein the pin lifter system has at least three pin lifter devices individually activatable for moving and positioning the substrate, wherein each of the pin lifter devices includes a coupling, which is designed for receiving a support pin embodied for contacting and supporting the substrate, and a drive unit having an electric motor, which is designed and interacts with the coupling in such a way that the coupling is linearly adjustable along an adjustment axis from a lowered normal position, in particular for providing the support pin in an essentially inactive state with respect to its intended effect, into an individual active position, in particular for providing the intended effect of receiving and/or providing the substrate by way of the support pin, and back the control and processing unit is connected to each of the drive units and is designed for controlling the electric motors and for executing the monitoring functionality and/or the position determination functionality and/or the positioning functionality for each of the pin lifter devices, wherein upon execution of the monitoring functionality, an item of state information is derived for each of the pin lifter devices, upon execution of the position determination functionality, a contact point is derived for each of the pin lifter devices, and upon execution of the positioning functionality, the coupling of each pin lifter device is moved into a respective individual contacting position.

15. The pin lifter system according to claim 14, wherein upon execution of the positioning functionality, the couplings are movable in a controlled manner into different positions, in particular wherein the support pins are extended by different distances.

* * * * *